(12) United States Patent
Wormsbecher et al.

(10) Patent No.: US 8,116,080 B2
(45) Date of Patent: Feb. 14, 2012

(54) CONTAINER-BASED DATA CENTER HAVING GREATER RACK DENSITY

(75) Inventors: Paul A. Wormsbecher, Apex, NC (US); Gregory J. McKnight, Chapel Hill, NC (US); Michael S. Miller, Raleigh, NC (US); Howard V. Mahaney, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 12/647,783

(22) Filed: Dec. 28, 2009

(65) Prior Publication Data

US 2011/0157829 A1   Jun. 30, 2011

(51) Int. Cl.
*H05K 7/20* (2006.01)
*G06F 1/20* (2006.01)

(52) U.S. Cl. ............... 361/701; 361/679.5; 361/679.53; 361/696; 361/699; 165/80.4; 165/80.5; 165/104.33; 454/184

(58) Field of Classification Search .............. 361/679.46 –679.48, 679.5, 679.53–679.54, 690, 694–696, 361/698–699, 701, 704; 165/80.4–80.5, 165/104.33, 185; 454/184
See application file for complete search history.

(56) References Cited

U.S. PATENT DOCUMENTS

| | | | | |
|---|---|---|---|---|
| 1,685,792 A * | 10/1928 | Warren | | 105/345 |
| 3,643,389 A | 2/1972 | Sheppley, Jr. | | |
| 3,730,583 A * | 5/1973 | Colovas et al. | | 296/64 |
| 5,062,242 A * | 11/1991 | Corcoran | | 52/36.1 |
| 5,140,787 A * | 8/1992 | Corcoran | | 52/36.1 |
| 5,345,779 A | 9/1994 | Feeney | | |
| 5,467,609 A | 11/1995 | Feeney | | |
| 6,305,180 B1 * | 10/2001 | Miller et al. | | 62/259.2 |
| 6,374,627 B1 | 4/2002 | Schumacher et al. | | |
| 7,278,273 B1 | 10/2007 | Whitted et al. | | |
| 7,365,973 B2 | 4/2008 | Rasmussen et al. | | |
| 7,511,960 B2 * | 3/2009 | Hillis et al. | | 361/702 |
| 7,551,971 B2 * | 6/2009 | Hillis | | 700/90 |
| 7,852,627 B2 * | 12/2010 | Schmitt et al. | | 361/695 |
| 7,854,652 B2 * | 12/2010 | Yates et al. | | 454/184 |
| 7,856,838 B2 * | 12/2010 | Hillis et al. | | 62/259.2 |
| 8,004,839 B2 * | 8/2011 | Sato et al. | | 361/696 |
| 2006/0082263 A1 | 4/2006 | Rimler et al. | | |
| 2006/0225446 A1 | 10/2006 | Bash et al. | | |

(Continued)

FOREIGN PATENT DOCUMENTS

GB   2444981 A   6/2008

(Continued)

*Primary Examiner* — Robert J Hoffberg
(74) *Attorney, Agent, or Firm* — Thomas E. Tyson

(57) ABSTRACT

A container includes first and second long sides parallel to the container's length. Racks are organized in rows parallel to the container's width. Each rack is receptive to installation of equipment along a height of the data rack parallel to the container's height. Openings are defined within the first and/or second long sides of the container. Heat exchangers may be installed, where each exchanger is installed on a rack to cool air exhausted by any equipment installed on this rack. Each row may include as many of the racks positioned side-to-side, length-wise, and parallel to the width of the container as can fit within the container. The racks of each row may be slidable in unison back and forth along the length of the container, between a first position at which the racks block an opening and a second position at which the racks block another opening.

13 Claims, 8 Drawing Sheets

U.S. PATENT DOCUMENTS

| | | |
|---|---|---|
| 2007/0281639 A1 | 12/2007 | Clidaras et al. |
| 2008/0055850 A1 | 3/2008 | Carlson et al. |
| 2008/0060790 A1 | 3/2008 | Yates et al. |
| 2008/0094797 A1 | 4/2008 | Coglitore et al. |
| 2008/0180908 A1 | 7/2008 | Wexler |
| 2008/0232064 A1 | 9/2008 | Sato et al. |
| 2008/0300725 A1 | 12/2008 | Brey et al. |
| 2009/0014397 A1 | 1/2009 | Moss et al. |
| 2009/0050591 A1 | 2/2009 | Hart et al. |
| 2009/0059523 A1 | 3/2009 | Mallia et al. |
| 2009/0100848 A1 | 4/2009 | Kuriyama et al. |
| 2009/0122483 A1* | 5/2009 | Hall .............................. 361/688 |
| 2009/0122487 A1 | 5/2009 | Campbell et al. |
| 2009/0151910 A1 | 6/2009 | Kwon et al. |
| 2010/0019631 A1* | 1/2010 | Olson .......................... 312/201 |
| 2010/0112925 A1* | 5/2010 | Schmitt et al. ................ 454/184 |
| 2010/0114356 A1* | 5/2010 | Schmitt et al. ................ 700/117 |
| 2010/0170277 A1* | 7/2010 | Schmitt et al. ............... 62/259.2 |

FOREIGN PATENT DOCUMENTS

| | | |
|---|---|---|
| JP | 2009134507 A | 6/2009 |

* cited by examiner

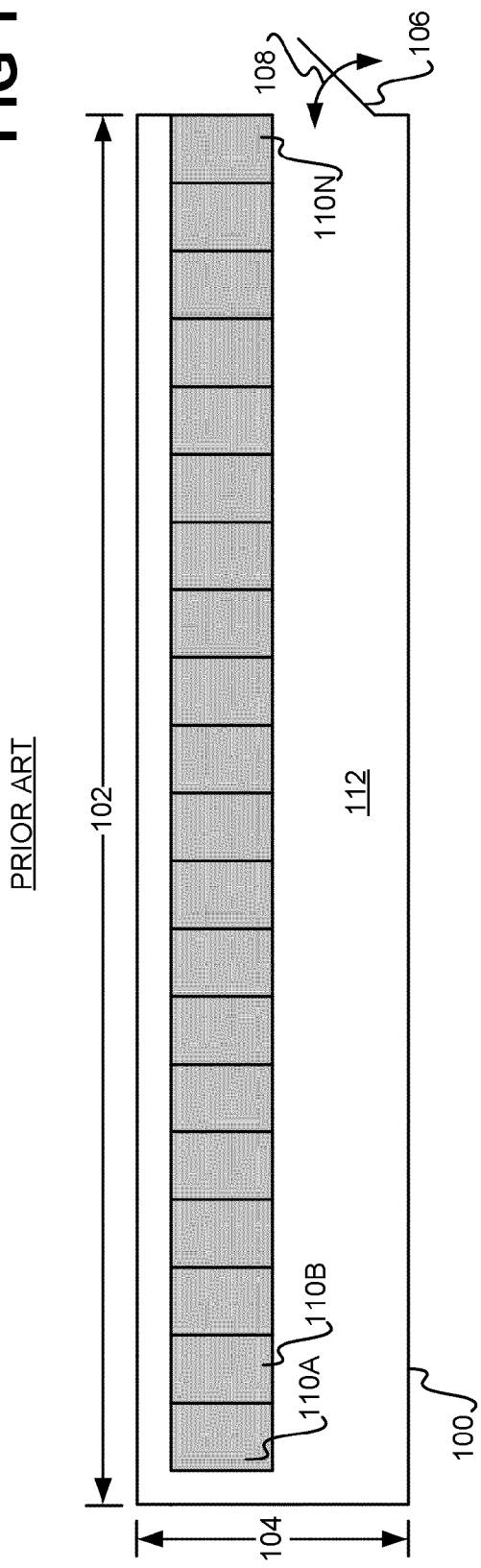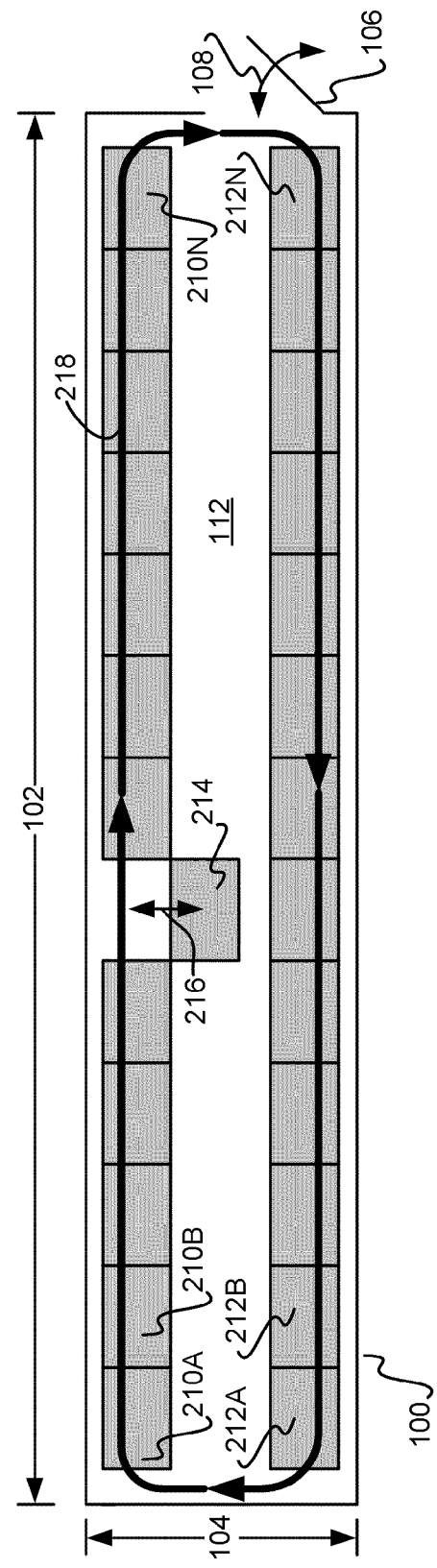

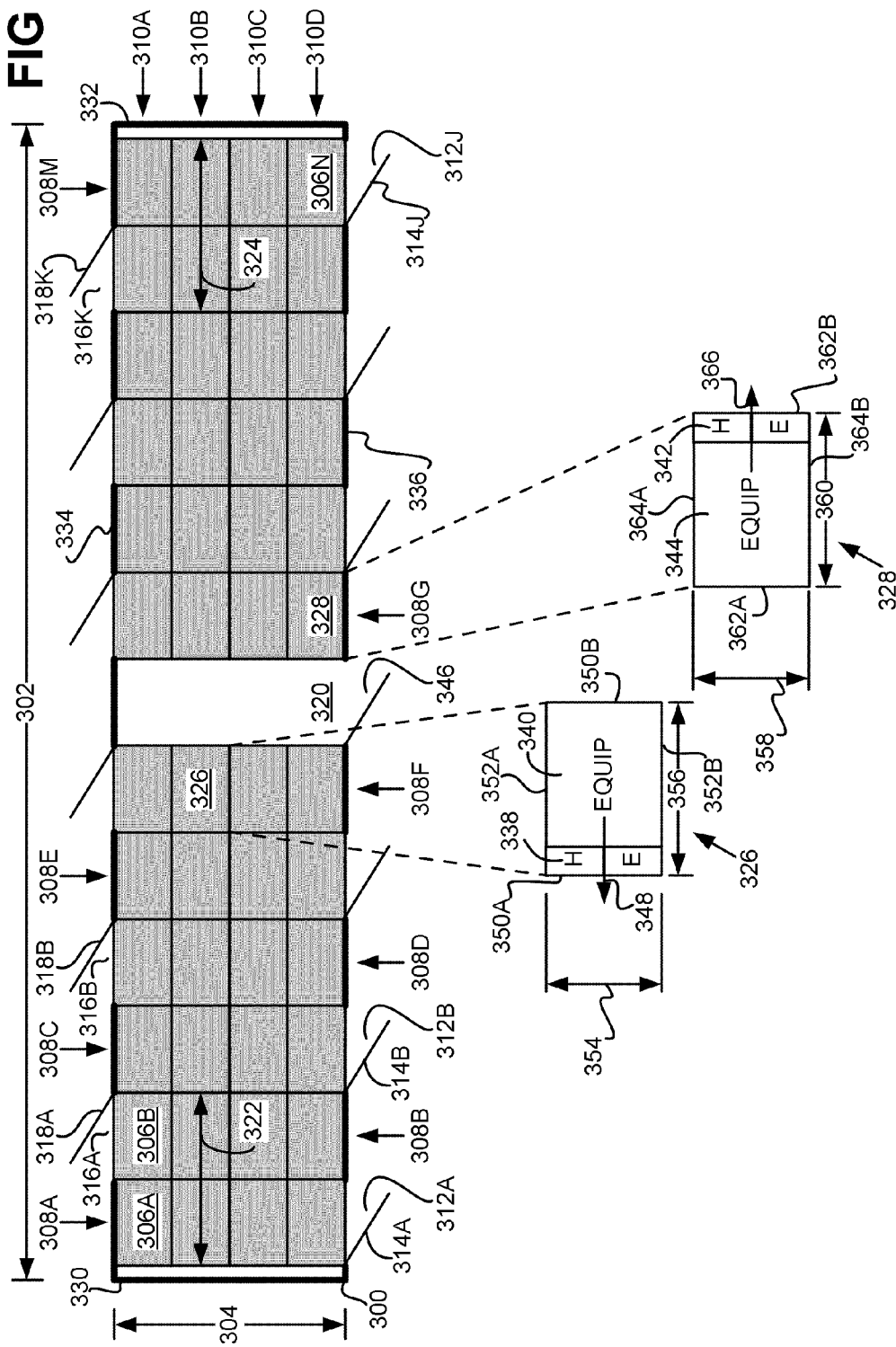

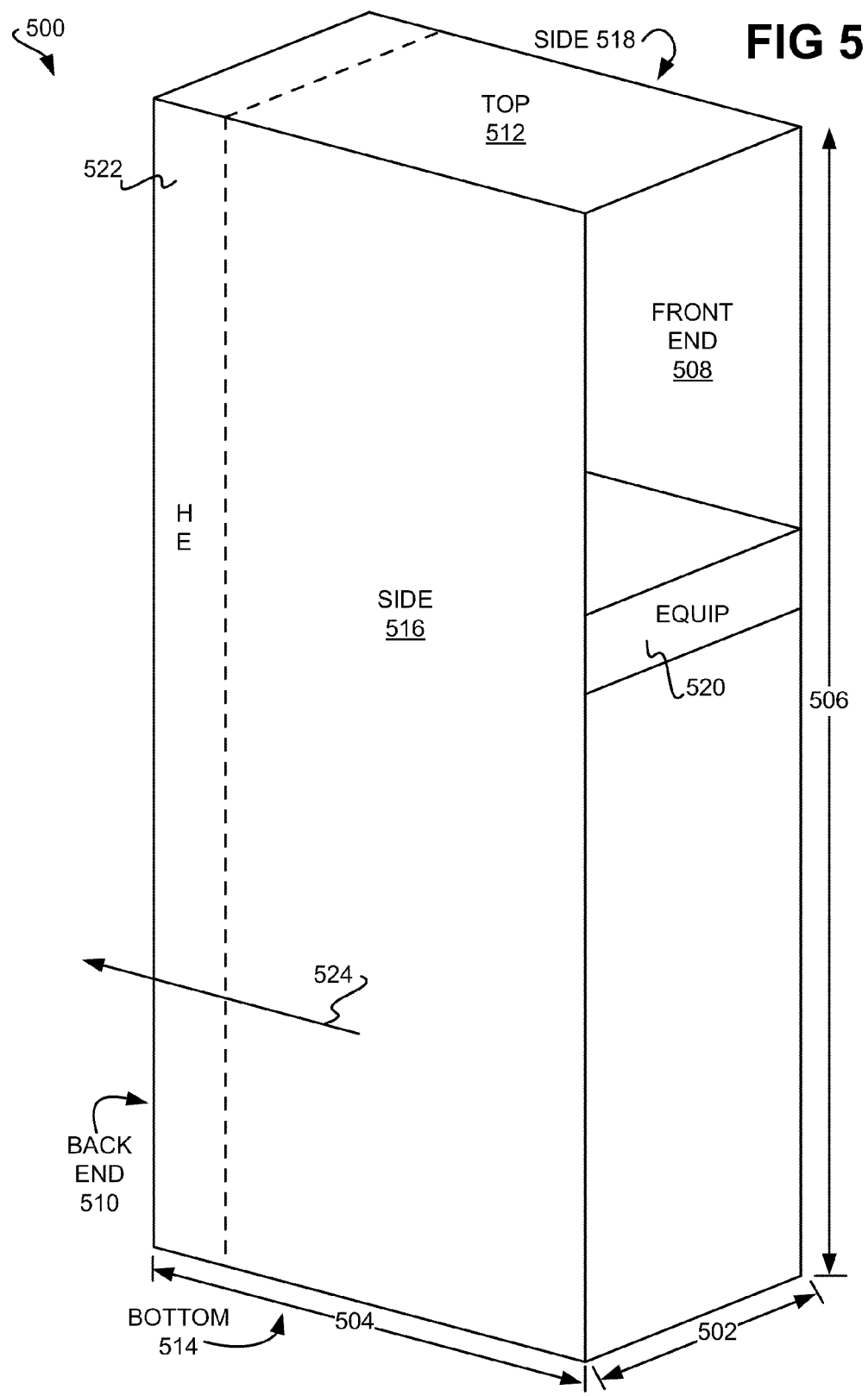

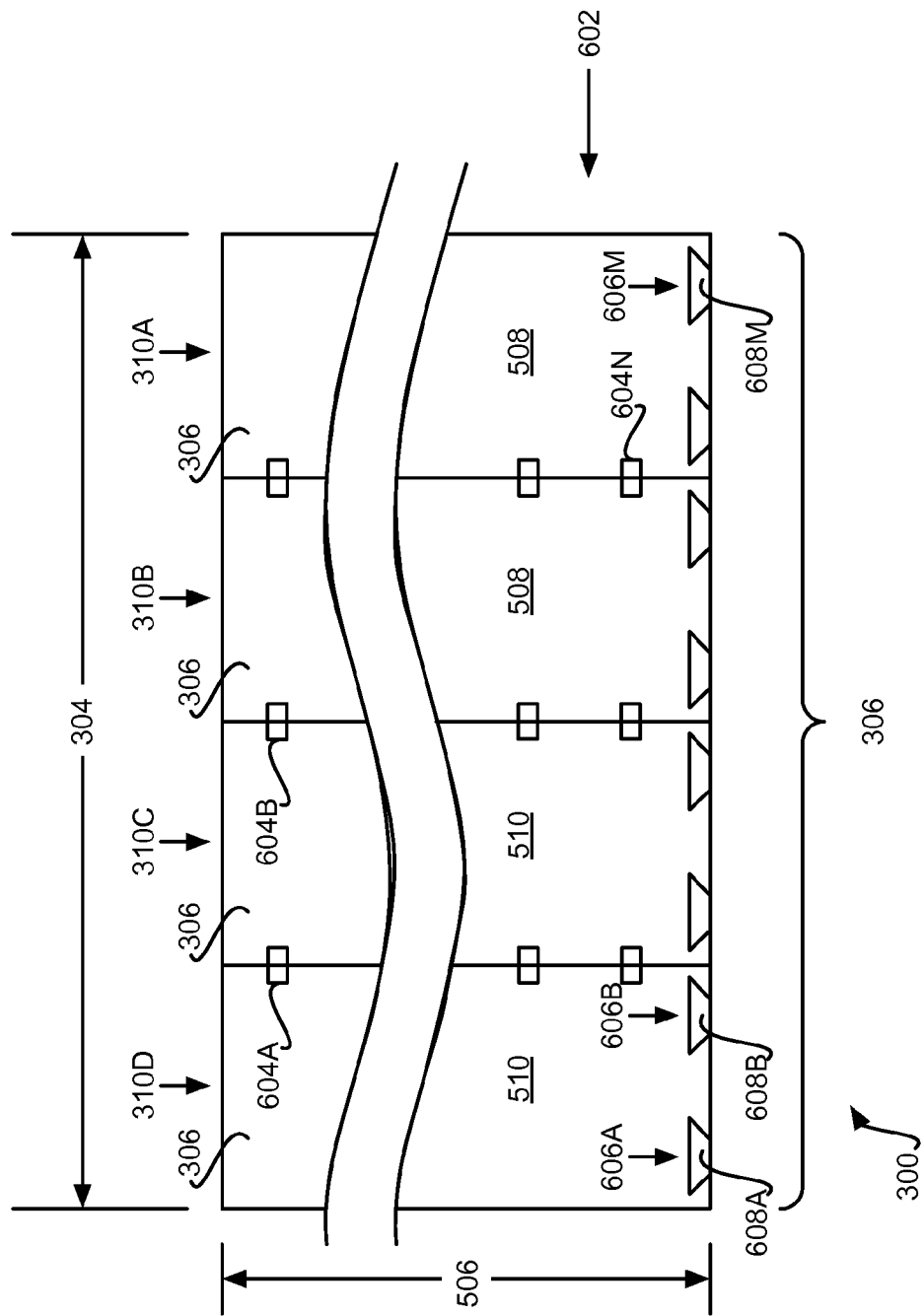

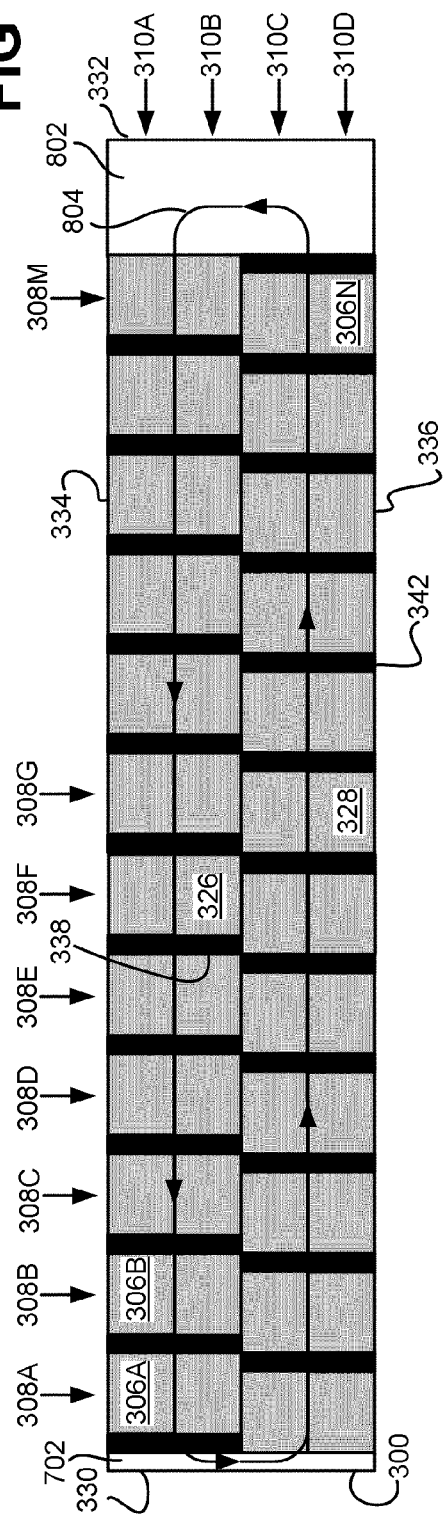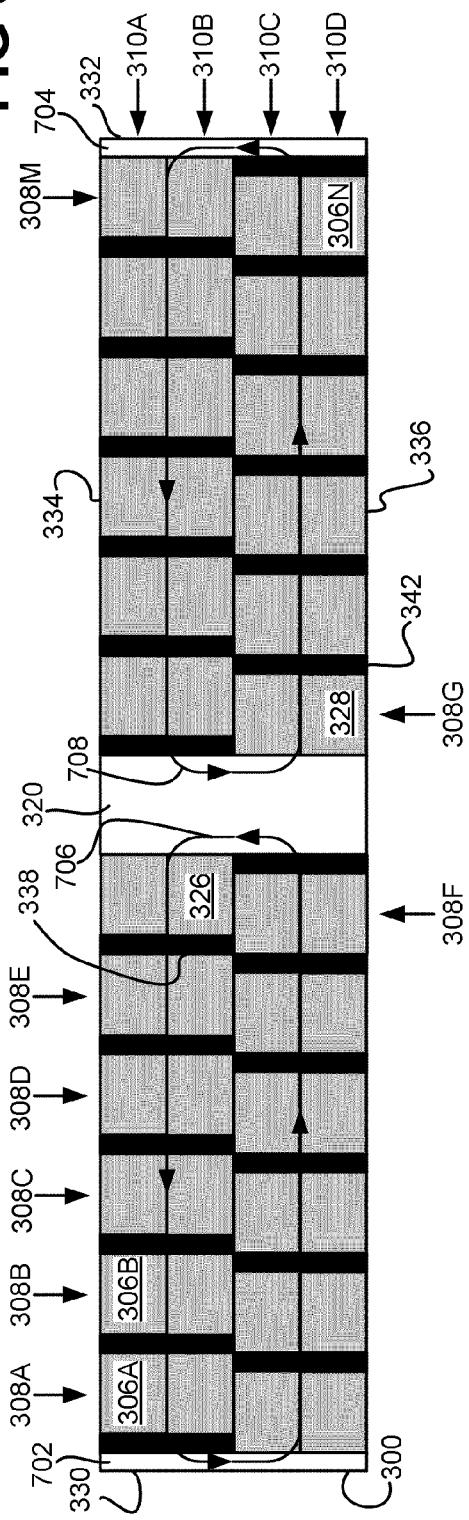

CONTAINER-BASED DATA CENTER HAVING GREATER RACK DENSITY

FIELD OF THE INVENTION

The present invention relates generally to container-based data centers, which are data centers that can be implemented using a shipping container. The present invention relates more particularly to such container-based data centers that have greater rack densities, in that the number of racks, and thus the amount of electronic equipment that can be installed on such racks, is greater than that provided by existing container-based data centers.

BACKGROUND OF THE INVENTION

A data center is a facility used to house computing systems and their associated components, such as telecommunications and storage systems. A data center can include redundant or backup power supplies, redundant data communications connections, environmental controls, such as air conditioning and fire suppression equipment, as well as security devices. A data center may also be referred to as a server farm, because a data center can house a large number of server computing devices.

Historically data centers have been housed within stationary buildings. For instance, a location having a suitable size, at a suitable place, and that has access to sufficient electrical power may be selected. Thereafter, a building may be built on the location for the purpose of housing a data center.

More recently, however, data centers have been increasingly housed in shipping containers. A shipping container is a container that can be placed on the trailer of a truck, on a cargo car of a train, or on a ship. The shipping container of such a container-based data center includes all the equipment needed to implement the data center. The shipping container can thus be built at one location, and then transported to the location at which the data center is to be used.

After the shipping container reaches its destination, external power and data communication lines just have to be connected to the data center to begin using the data center, since all the equipment of the data center has already been installed within the container. Container-based data centers have become popular. This is because they are an easy and fast way by which additional computing capacity can be installed at a given location.

SUMMARY OF THE INVENTION

A system of an embodiment of the invention includes a container, a number of racks, and a number of openings. The container has a width, a length, and a height. A first long side and a second long side are both parallel to the length of the container. The racks are organized in rows parallel to the width of the container. Each rack is receptive to installation of electronic equipment along a height of the rack parallel to the height of the container. The openings are located within the first long side and/or the second long side of the container.

A system of another embodiment of the invention includes a container, a number of racks, a number of heat exchangers, and a number of openings. The container has a width, a length, and a height. A first long side and a second long side are both parallel to the length of the container. The racks are organized in rows parallel to the width of the container. Each rack is receptive to installation of electronic equipment along a height of the rack parallel to the height of the container. Each heat exchanger is installed on one of the racks to cool air exhausted by any electronic equipment installed on the rack in question. The openings are located within the first long side and/or the second long side of the container.

In a method of an embodiment of the invention, a given opening of a number of openings within one or more long sides of a container is accessed. The container has a width, a length, and a height, and the long sides of the container are parallel to the container's length. After the given opening is accessed, an aisle corresponding to the given opening is entered. Thereafter racks located to one or more sides of the aisle are accessed. The racks are organized in one or more rows parallel to the width of the container. The racks are receptive to installation of electronic equipment along heights of the racks parallel to the height of the container.

BRIEF DESCRIPTION OF THE DRAWINGS

FIGS. 1 and 2 are diagrams of container-based data centers, according to the prior art.

FIG. 3 is a diagram of a container-based data center, according to an embodiment of the present invention.

FIG. 5 is a diagram of a perspective view of an exemplary rack that can be installed in the data center of FIG. 3, according to an embodiment of the present invention.

FIG. 6 is a diagram of a respective row of racks of the container-based data center of FIG. 3, according to an embodiment of the present invention.

FIGS. 7 and 8 are diagrams showing airflow loops within a container-based data center, according to embodiments of the present invention.

Figure 4:
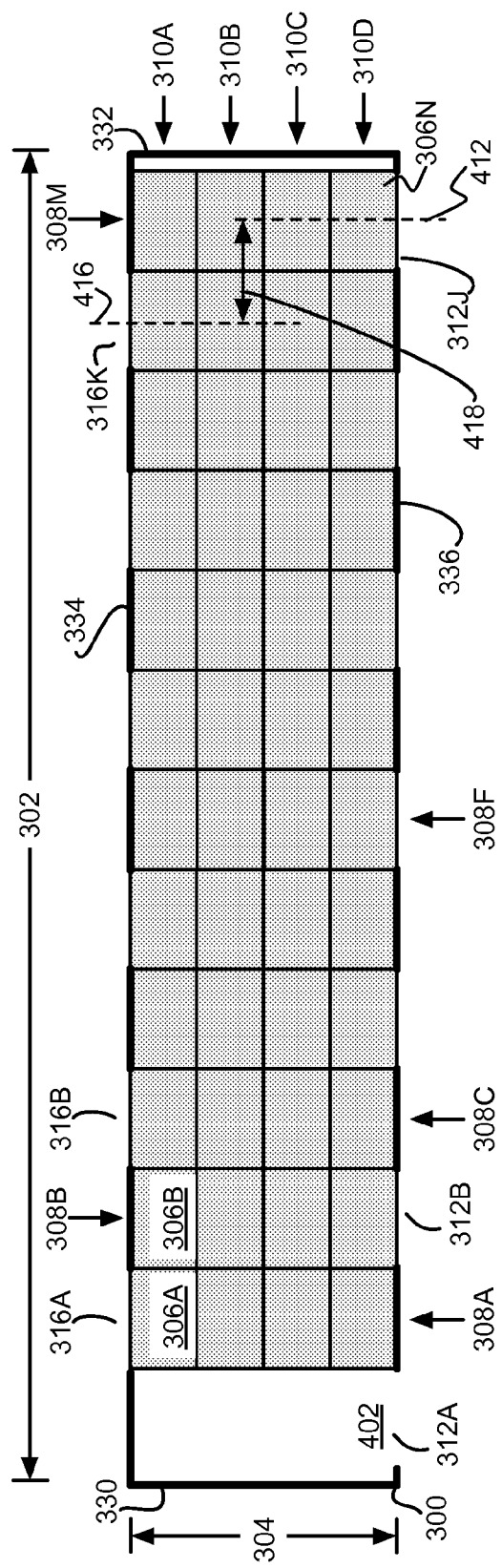
FIG. 4 is a diagram of the container-based data center of FIG. 3 in which rows of racks have been slid relative to their position in FIG. 3, according to an embodiment of the present invention.

The use of lettered reference numbers herein is not intended to and does not imply the quantity of the elements referred to by such lettered reference numbers, but rather only implies the relative ordering of such elements in relation to one another, and distinguishes like elements from one another. For example, in FIG. 1, there are twenty elements 110, whereas in FIG. 2, there are thirteen elements 210. Nevertheless, the last element 110 is referenced by 110N, and the last element 210 is referenced by 210N; that is, both the last element 110 and the last element 210 are referenced by the same letter. Furthermore, the last letter used in this numbering scheme does not imply that total number of elements corresponds to the order of this letter in the alphabet. For example, in FIG. 1, the last element 110 is referenced by 110N, and N is the fourteenth letter of the alphabet; nevertheless, there are twenty elements 110, not fourteen, in FIG. 1.

DETAILED DESCRIPTION OF THE DRAWINGS

As noted in the background section, container-based data centers have become increasingly popular. A typical container may be roughly twenty or forty feet in length, and have a width of roughly eight feet. A container having these dimensions corresponds to a standard shipping container that can be placed on a trailer and pulled by a truck, or that can be placed on a cargo car and pulled by a train.

Typically, the square footage of a container is dedicated to two things. First, some of the square footage is dedicated to the installation of racks, such as equipment racks or data racks, and which may extend from substantially the floor of the container to substantially the ceiling of the container. Electronic equipment is then installed within the racks. Second, other square footage of the container is dedicated to floor space a user can walk on to access and service the equipment installed on the racks.

The greater the amount of space within a container that can be dedicated to the installation of racks, the more equipment that can be installed within the container. This means that when a given number of server computing devices are needed, for example, a lesser number of containers are needed. Because the space at which the containers can be located may be at a premium, it is desirable to have the least number of containers possible to provide a given number of server computing devices. Furthermore, minimizing the number of containers needed reduces total cost, both in container acquisition and in container upkeep. Container acquisition costs are reduced because there are fewer containers to purchase. Container upkeep costs are likewise reduced because there are fewer containers to operationally maintain.

Existing configurations of racks within a container, however, waste significant amounts of space so that a user can access and service the equipment installed on the racks. FIGS. 1 and 2 show two such existing approaches, according to the prior art. A shipping container 100 has a length 102 and a width 104. An opening 106 at an end of the container 100 along the width permits a user to enter the container 100, by opening a door 108 to the opening 106.

In FIG. 1, twenty racks 110A, 110B, . . . , 110N, collectively referred to as the racks 110, are placed side-to-side, length-wise, along and parallel to the length 102 of the shipping container 100. An aisle 112 also runs along the length 102 of the container 100, so that equipment installed within the racks 110 is user accessible. The fronts of the equipment installed within the racks 110 faces the aisle 112. The racks 110 may be able to slide in unison across the width 104, so that the aisle 112 can be defined behind the racks 110 as well as in front of the racks 110 as is depicted in FIG. 1. In the prior art of FIG. 1, cooling of the equipment installed within the racks 110 is typically achieved by employing heat exchangers installed above the racks 110, at or near the ceiling of the shipping container 100.

In prior art similar to that of FIG. 1, there may two columns of racks 110, one to the back of the aisle 112, as shown in FIG. 1, and another to the front of the aisle 112, which is not shown in FIG. 1. There may be a heat exchanger positioned between each adjacent pair of racks 110. The equipment is installed within the racks 110 such that the backs of the equipment each face the aisle 112. Airflow is directed from the front of the equipment through the rear of the equipment, and into the aisle 112. The heat exchanger positioned between each adjacent pair of racks 110 draws the heated air exhausted by the equipment into the aisle 112, and exhausts the resulting cooled air to the space between the front of the equipment and the front or back of the container 100.

In FIG. 2, thirteen racks 210A, 210B, . . . , 210N, collectively referred to as the racks 210 and including rack 214A, are placed front-to-back, depth-wise, in a back column along and parallel to the length 102 of the shipping container 100. Similarly, thirteen racks 212A, 212B, . . . , 212N, collectively referred to as the racks 212 and including rack 214B, are placed back-to-front, depth-wise, in a front column along and parallel to the length 102 of the container 100. The fronts of the equipment installed within the racks 210 face the right of the container 100, whereas the fronts of the equipment installed within the racks 212 face the left of the container 100. The aisle 112 runs along the length of the container 100 between the front and the back columns.

Each rack 210 and 212 can slide into the aisle 112. For example, when equipment installed within the rack 214 is to be accessed by a user, the user slides the rack 214 into the aisle 112, as indicated by the arrow 216. When the user is finished servicing this equipment, he or she slides the rack 214 back, as also indicated by the arrow 216.

Cooling of the equipment within the racks 210 and 212 is typically achieved by having an airflow loop 218. The heat exchangers employed to cool the equipment within the racks 210 and 212 are fixed in place, and do not slide with the racks 210 and 212 when the racks 210 and 212 are slid into the aisle 112. Therefore, for example, when the rack 214 is pulled into the aisle 112, the rack 214 is not cooled, because it is removed from the airflow loop 218. It is said that cooling of the equipment installed on the rack 214 is interrupted.

In prior art similar to that of FIG. 2, racks 210 and 212 are installed to either side of an aisle 112, as in FIG. 2, but the racks 210 and 212 cannot slide as they can in FIG. 2. In other similar prior art, some racks 210 and 212 may slide along the parallel to the aisle 112, and other racks 210 and 212 may slide perpendicular to the aisle 112 as in FIG. 2. In general, however, the number of racks 210 and 212 that are disposed within the container 100 is similar to the number of racks 210 and 212 that are disposed within the container 100 in the prior art of FIG. 2.

Embodiments of the invention overcome the disadvantages associated with the prior art that have been described in relation to FIGS. 1 and 2. First, embodiments of the invention provide for a configuration of racks within a shipping container that permits significantly more racks to be installed within the container, such that much more equipment can be installed in a given shipping container, as compared to FIGS. 1 and 2. Second, embodiments of the invention that employ racks that can slide do not have the racks slide into an aisle, and such that cooling is not interrupted as it is in FIG. 2.

FIG. 3 shows a shipping container 300, according to an embodiment of the invention. The container 300 has a length 302 and a width 304. The length 302 may be roughly twenty or forty feet in one embodiment, whereas the width 304 may be roughly eight feet. The shipping container 300 has long sides 334 and 336 parallel to the length 302 and opposite to one another, and ends 330 and 332 parallel to the width 304 and opposite to one another. The long side 336 includes openings 312A, 312B, . . . , 312J, which are collectively referred to as the openings 312 and that include opening 346. The long side 334 includes openings 316A, 316B, . . . , 316K, which are collectively referred to as openings 316. There may be doors 314A, 314B, . . . , 314J, which are collectively referred to as the doors 314, and which correspond to the openings 312. Likewise, there may be doors 318A, 318B, . . . , 318K, which are collectively referred to as the doors 318, and which correspond to the openings 316.

The openings 312A and 312J are specifically referred to as end openings that are closest to the ends 330 and 332. For instance, the opening 312A is closest to the end 330, and the opening 312J is closest to the end 332. In the example of FIG. 3, each of the end openings are one of the openings 312. However, in other embodiments, each of the end openings may be one of the openings 316, or one end opening may be an opening 312 and the other end opening may be an opening 316.

Furthermore, the openings 312 and 316 are staggered in relation to one another along the length 302 of the container 300. In the embodiment of FIG. 3, for instance, there is an opening 316 between each adjacent pair of openings 312 along the length 302 of the container 300, and there is an opening 312 between each adjacent pair of openings 316 along the length 302 of the container 300. For example, the opening 316A is between the openings 312A and 312B along the length 302 of the container 300. In other embodiments, the openings 312 and 316 may be staggered in relation to one another along the length 302 of the container 300 in different ways. As just one example, there may be two openings 316 between each adjacent pair of two openings 312, and two openings 312 between each adjacent pair of two openings 316, along the length 302 of the container 300.

The container 300 also includes racks 306A, 306B, . . . , 306N, which are collectively referred to as the racks 306 and that include the racks 326 and 328. The racks 306 are organized over a number of rows 308A, 308B, 308C, 308D, 308E, 308F, 308G, . . . , 308M, which are collectively referred to as the rows 308, and over a number of columns 310A, 310B, 310C, and 310D, which are collectively referred to as the columns 310. There are four racks 306 in each row 308 in the embodiment of FIG. 3. Furthermore, in the embodiment of FIG. 3, there are twelve rows 308, but in other embodiments, there may be different numbers of rows 308, such as thirteen rows 308 in one embodiment, depending on the size of the racks 306.

The rack 326 is representative of all the racks 306 within the columns 310A and 310B. The rack 326 has a length 354 and a depth 356. The rack 326 includes a back end 350A and a front end 350B, which are collectively referred to as the ends 350, as well as sides 352A and 352B, which are collectively referred to as the sides 352. A heat exchanger 338 and equipment 340 are installed within the rack 326. The heat exchanger 338 may be active, pulling hot air from the equipment 340 from the right and exhausts cooled air to the left, as indicated by the arrow 348. Alternatively, the heat exchanger 338 may be passive, relying on the equipment 340 to move air through the exchanger 338. In either case, the heat exchanger 338 cools the air exhausted by the equipment 340. The heat exchanger may be a heat pump, an air conditioner, or another type of mechanism that cools air that passes through the mechanism.

The heat exchanger 338 in one embodiment preferably removes all the heat introduced into the air by the equipment 340. For example, if the air entering the equipment 340 has a temperature of X degrees and the air exiting the equipment 340 has a temperature of Y degrees that is greater than X, the air entering the heat exchanger 338 is also at a temperature of Y degrees. Therefore, the air exiting the heat exchanger 338 is at a temperature no greater than X degrees. That is, the heat exchanger 338 is able to cool the air at least by Y minus X degrees, for a maximum potential temperature of Y degrees at which air exits the equipment 340.

The rack 328 is representative of all the racks within the columns 310C and 310D. The rack 328 has a length 358, which is equal to the length 354 of the rack 326, and a depth 360, which is equal to the depth 356 of the rack 326. The rack 328 includes a front end 362A and a back end 362B, which are collectively referred to as the ends 362, as well as sides 364A and 364B, which are collectively referred to as the sides 364. A heat exchanger 342 and equipment 344 are installed within the rack 328. If the heat exchanger 342 is active, the exchanger 342 pulls hot air from the equipment 344 from the left and exhausts cooled air to the right, as indicated by the arrow 366. If the heat exchanger 342 is passive, the exchanger 342 relies on the equipment 344 to move air through the exchanger 342. In either case, the heat exchanger 342 cools the air exhausted by the equipment 344. The heat exchanger may be a heat pump, an air conditioner, or another type of mechanism that cools air that passes through the mechanism. As with the heat exchanger 338, the heat exchanger 342 in one embodiment preferably removes all the heat introduced into the air by the equipment 344.

Each row 308 of the container 300 in the embodiment of FIG. 3 includes four racks 306 positioned side-to-side, length-wise, and parallel to the width 304, such that there are four columns 310. More generally, each row 308 includes as many of the racks 306 positioned side-side, length-wise, and parallel to the width 304 of the container 300 as can fit within the container 300, such that there may be greater or less of the columns 310 than four columns 310. The racks 306 of each row 308 are slidable in unison back and forth along the length 302 of the container 300, between a first position at which the racks 306 block one of the openings 312 and 316 and a second position at which the racks 306 block the opening 312 or 316 that is closest to the opening that the racks 306 block in the first position.

For example, the racks 306 of the row 308A are slidable in unison back and forth parallel to the length 302 of the container 300, as indicated by the arrow 322. In a first position, the racks 306 of the row 308A block the opening 312A, as is specifically depicted in FIG. 3. In a second position, the racks 306 of the row 308A block the opening 316A, which is not shown in FIG. 3. As another example, the racks 306 of the row 308M are also slidable in unison back and forth parallel to the length 302 of the container 300, as indicated by the arrow 324. In a first position, the racks 306 of the row 308M block the opening 312J, as is specifically depicted in FIG. 3. In a second position, the racks 306 of the row 308M block the opening 316K, which is not shown in FIG. 3.

At any given time, all of the openings 312 and 316 are blocked by the rows 308 of racks 306 except for a given opening, such as one given opening in the embodiment of FIG. 3, which provides user access to a given aisle within the container 300 that is parallel to the width 304 of the container 300. In the example of FIG. 3, the opening 346 is not blocked by any row 308 of racks 306, which provides user access to given aisle 320 within the container 300. As such, the user has access to the equipment of the two racks 306 that are within the row 308F and the columns 310A and 310B, and to the equipment of the two racks 306 that are within the row 308G and the columns 310C and 310C. Furthermore, the user has access to the heat exchangers of the two racks 306 that are within the row 308F and the columns 310C and 310D, and to the heat exchangers of the two racks 306 that are within the row 308G and the columns 310A and 310B.

It is noted that in general, there can be as many rows 308 parallel to the length 302 of the container 300 that can fit within the container 300, minus one, where two further considerations are taken into account. The first consideration is to provide adequate space at the ends 330 and 332 of the container 300 for an airflow loop to be closed, which is described in detail later in the detailed description. In one embodiment, the space at each end 330 and 332 can be equal to the length 354 and 358. The second consideration is to ensure that the aisle 320 that can be created is sufficient in size to permit a person to enter the aisle 320 to service the equipment installed on the racks to either side of the aisle 320. In one embodiment, then, the number of rows 308 may be equal to the number of rows 308 parallel to the length 302 of the container 300 that can fit within the container 300, minus one.

Which of the openings 312 and 316 is the given opening that is not blocked by any of the rows 308 to provide user access to a corresponding aisle within the container 300 that is parallel to the width 304 of the container 300 changes, depending on where the rows 308 of the racks 306 have been slid along the length 302 of the container 300. As such, each of the openings 312 and 316 can be the given opening that is not blocked by any of the rows 308 at any given time. The user slides the rows 308 of the racks 306 as needed to access a desired opening 312 or 316. For instance, based on which equipment or heat exchanger of which rack 306 the user has to access, the user suitably slides the rows 308 of the racks 306 so that an aisle is created that provides access to this equipment or heat exchanger. The user then enters the opening corresponding to this aisle.

It is noted that in the specific example of FIG. 3, the racks 306 within two rows 308F and 308G are currently user accessible, because the opening 346 is user accessible and permits a user to enter the corresponding aisle 320. In general, where the given opening that is currently user accessible to permit a user to enter a corresponding aisle is any of the openings 312 and 316 except for the end openings 312A and 312J, the user is permitted to access the racks 306 within two rows 308 that are to either side of the aisle that has been created. The racks 306 of all other rows 308 are user inaccessible. For example, if the opening 316B were user accessible, then the user would be permitted to enter the corresponding aisle and access the racks 306 within the rows 308C and 308D. The racks 306 within all other rows 308 except for the rows 308C and 308D would in this case be user inaccessible.

By comparison, where the given opening that is currently user accessible to permit a user to enter a corresponding aisle is one of the end openings 312A and 312J, the user is permitted to access the racks 306 within just one row 308 to one side of the given aisle that has been created. The racks 306 of all other rows 308 are user inaccessible. FIG. 4 shows the shipping container 300 in such a scenario, according to an embodiment of the invention. As in FIG. 3, the container 300 has a length 302, a width 304, long sides 334 and 336, ends 330 and 332, and openings 312 and 316. The racks 306 are organized over a number of rows 308 and columns 310. The doors 314 and 318 of FIG. 3 are not shown in FIG. 4 for illustrative convenience.

In FIG. 4, all of the rows 308 of racks 306 have been moved towards the end 332 of the container 300. As such, the end opening 312A is accessible, and defines an aisle 402 in which the user to enter. Because the opening 312A is an end opening, just the one row 308A of racks 306 to the right of the aisle 402 is accessible to the user. This is because there is no row 308 of racks 306 to the left of the aisle 402. The racks 306 of all other rows 308 are thus user inaccessible. Similarly, in another scenario, where all of the rows 308 of racks 306 are moved towards the end 330 of the container 300, the end opening 312J would be accessible, and just one row 308M to the left of the defined aisle would be accessible to the user.

In the configuration of FIGS. 3 and 4 that has been described, there are forty-eight racks 306 organized over twelve rows 308 and four columns 310. By comparison, in the prior art configuration of FIG. 1, there are just twenty similarly sized racks 110, and in the prior art configuration of FIG. 2, there are twenty-six similarly sized racks 210 and 212. Therefore, the configuration of FIGS. 3 and 4 represents an increase in rack capacity and in rack density of 140% in relation to FIG. 1, and of nearly 85% in relation to FIG. 2.

Each of the openings 312 and 316 has a center. For example, as depicted in FIG. 4, the opening 312J has a center 412, and the opening 316K has a center 416. A distance is defined between the center of each opening 312 and the center(s) of the one or more openings 316 that are closest thereto (and vice-versa) along the length 302 of the container 300. For example, as depicted in FIG. 4, the opening 316K is the opening 316 that is the closest to the opening 312J. Therefore, a distance 418 is defined between the center 416 of the opening 316K and the center 412 of the opening 312J.

FIG. 5 shows a perspective view of a representative rack 500, according to an embodiment of the invention. The rack 500 is representative of the racks 306 that have been described. The rack 500 has a length 502 corresponding to the lengths 354 and 358 of the racks 326 and 328 of FIG. 3, a depth 504 corresponding to the depths 356 and 360 of the racks 326 and 328, and a height 506.

The length 502 may be a standard rack length (or width) of nineteen inches. Alternatively, the length 502 may be other than nineteen inches, such as forty-seven inches in the case of an IDATAPLEX rack, where IDATAPLEX is a trademark of International Business Machines Corp., of Armonk, N.Y. The depth 504 is variable, and in the example of FIG. 5 may be twenty-four inches. The height 506 of the rack 500 may correspond substantially to the height of the shipping container 300 itself, from substantially the floor of the container 300 to substantially the ceiling of the container 300, minus any space needed for ductwork and other equipment that may be present at the top or the bottom of the container 300. For simplicity, then, the height 506 of the rack 500 in FIG. 5 may be considered as being substantially equal, if not identical, to the height of the container 300. In one embodiment, the height of the shipping container 300 is eight feet, six inches.

The rack 500 has a front end 508 corresponding to the front ends 350B and 362A of the racks 326 and 328 of FIG. 3, and a back end 510 corresponding to the back ends 350A and 362B of the racks 326 and 328. The rack 500 further has sides 516 and 518 corresponding to the sides 352B and 352A, respectively, of the rack 326, and to the sides 364A and 364B, respectively of the rack 328. The rack 500 further has a top 512 and a bottom 514.

The rack 500 is receptive to the installation of electronic equipment along the height 506 of the rack 500 (and parallel to the height of the container 300), within the front end 508. As depicted in FIG. 5, a single piece of equipment 520 has been installed within the rack 500. Other equipment, however, can be stacked below and above the piece of equipment 520. Such equipment and the equipment 520 correspond to the equipment 340 and 344 of the racks 326 and 328 of FIG. 3. Equipment is typically specified as occupying a number of standard rack heights, where a standard rack height is 1.75 inches and is referred to as a "U". For example, a 4U server occupies 4×1.75 inches=7 inches of rack height, whereas a 1U server occupies just 1.75 inches of rack height.

The rack 500 is also receptive to a heat exchanger 522, which corresponds to the heat exchangers 338 and 342 of the racks 326 and 328 of FIG. 3. The heat exchanger 522 cools hot air exhausted from the equipment installed within the rack 500, as indicated by the arrow 524, such that the air exiting the exchanger 522 has been cooled. In the embodiment of FIG. 5, the heat exchanger 522 extends from side 516 to side 518, and from top 512 to bottom 514, of the rack 500, although in other embodiments, this may not be the case.

Whereas FIGS. 3 and 4 have showed the shipping container 300 over its length 302 and its width 304, FIG. 6 shows the container 300 over its width 304 and the height 506, according to an embodiment of the invention. A representative row 602 of the racks 306 is specifically depicted in FIG. 6. The row 602 is representative of the rows 308 of racks 306 that have been described. The back end 510 of each rack 306 in the columns 310C and 310D can be seen, as can the front end 508 of each rack 306 in the columns 310A and 310B.

In FIG. 6, the height of the shipping container 300 is implicitly the height 506 of the racks 306. However, as noted above in relation to FIG. 5, the height 506 of the racks 306 may in actuality correspond substantially to the height of the container 300 itself, from substantially the floor of the container 300 to substantially the ceiling of the container 300, minus any space needed for ductwork and other equipment that may be present at the top or the bottom of the container 300. For simplicity, then, the height 506 of the rack 300 in FIG. 6 may be considered as being substantially equal, if not identical, to the height of the container 300.

The racks 306 of the row 602 can be attached to one another. For example, rivets 604A, 604B, . . . , 604N, collectively referred to as the rivets 604, may each be used to attach the sides of two adjacent racks 306 together within the row 602. Other fastening and/or attachment mechanisms may be used as well, in addition to and/or in lieu of the rivets 604. The rivets 604 and/or other attachment mechanisms attach the racks 306 of the row 602 together, so that the racks 306 of the row 602 move in unison as a single entity.

The racks 306 of the row 602 are able to slide in unison particularly into and out of the plane of FIG. 6. In one embodiment, the row 602 of racks 306 is able to slide as follows. Tracks 608A, 608B, . . . , 608M, collectively referred to as the tracks 608, are attached to the floor of the shipping container 300. The bottoms of the racks 306 have grooves 606A, 606B, . . . , 606M, collectively referred to as the grooves 606, that corresponding to these tracks. There may be at least one groove 606 for each rack 306, such as two grooves 606 for each rack 306 as in the example of FIG. 6. The tracks 608 fit into the grooves 606, permitting the racks 306 of the row 602 to slide into and out of the plane of FIG. 6.

The tracks 608 and the grooves 606 may alternatively be located on the top instead of on the bottom as depicted in FIG. 6. In another embodiment, the tracks 608 and the grooves 606 may be located both on the top and the bottom. Furthermore, the grooves 606 may alternatively be located within the container 300 and the tracks may be located on the racks 306. Finally, other mechanisms that permit the racks 306 of the row 602 to slide in unison into and out of the plane of FIG. 6 may be employed, in addition to or in lieu of tracks and grooves.

FIG. 7 shows how the airflow within the shipping container 300 is not affected by the creation of an aisle at an end of the container 300, according to an embodiment of the invention. The container in FIG. 7 includes the racks 306, including racks 326 and 328, organized over the rows 308 and the columns 310, as before. An aisle 802 has been defined to the right of the racks 306 of the row 308M, between the row 308M and the end 332 of the container 300. The openings 312 and the doors 314 are not depicted in FIG. 7 for illustrative convenience.

As has been described above, the racks 306 of the columns 310A and 310B—i.e., the racks 306 closer to the long side 334 than to the long side 336 of the container 300—have their heat exchangers positioned such that air moves therethrough towards the end 330 of the container 300. For example, the rack 326 has the heat exchanger 338 through which air is moved towards the end 330. Similarly, the racks 306 of the columns 310C and 310D—i.e., the racks 306 closer to the long side 336 than to the long side 334 of the container 300—have their heat exchangers positioned such that air moves therethrough towards the end 332 of the container 300. For example, the rack 328 has the heat exchanger 342 through which air is moved towards the end 332. The racks 306 of the columns 310A and 310B thus have heat exchangers that are closer to the long side 334 than the heat exchangers of the racks 306 of the columns 310C and 310D are. Similarly, the racks 306 of the columns 310C and 310D have heat exchangers that are closer to the long side 336 than the heat exchangers of the racks 306 of the columns 310A and 310B are.

A single airflow loop 804 resulting from air moving through the heat exchangers of the racks 306 are defined in the case where an aisle, such as the aisle 802, is defined at an end of the container 300, such as the end 332. In the airflow loop 804, the air moves through the heat exchangers of the racks 306 in the columns 310A and 310B towards the end 330 of the container 300. When the air reaches the end 330, there is a sufficient space 702 so that the air can turn 180 degrees, at which point the air moves through the heat exchangers of the racks in the columns 310C and 310D towards the end 332. It is noted in this respect that the space 702 may be larger than is actually depicted in FIG. 7. When the air reaches the aisle 802, the air turns 180 degrees, at which point the air again moves through the heat exchangers of the racks 306 in the columns 310A and 310B, completing the airflow loop 804. As such, just one airflow loop 804 is defined in FIG. 7.

FIG. 8 shows how the airflow within the shipping container 300 is not affected by the creation of an aisle between two rows, according to an embodiment of the invention. The container 300 in FIG. 8 includes the racks 306, including racks 326 and 328, organized over the rows 308 and the columns 310, as before. An aisle 320 has been defined between the racks 306 of the row 308F, including the rack 326, and the racks 306 of the row 308G, including the rack 328. The openings 312 and the doors 314 are not depicted in FIG. 8 for illustrative convenience.

As has been described above, the racks 306 of the columns 310A and 310B—i.e., the racks 306 closer to the long side 334 than to the long side 336 of the container 300—have their heat exchangers positioned such that the air cooled by these exchangers is directed towards the end 330 of the container 300. For example, the rack 326 has the heat exchanger 338 that directs air towards the end 330. Similarly, the racks 306 of the columns 310C and 310D—i.e., the racks 306 closer to the long side 336 than to the long side 334 of the container 300—have their heat exchangers positioned such that air cooled by these exchangers is directed towards the end 332 of the container 300. For example, the rack 328 has the heat exchanger 342 that directs air towards the end 332. The racks 306 of the columns 310A and 310B thus have heat exchangers that are closer to the long side 334 than the heat exchangers of the racks 306 of the columns 310C and 310D are. Similarly, the racks 306 of the columns 310C and 310D have heat exchangers that are closer to the long side 336 than the heat exchangers of the racks 306 of the columns 310A and 310B are.

Two idealized airflow loops 706 and 708 resulting from air moved through the heat exchangers of the racks 306 are defined in the case where an aisle, such as the aisle 320, is defined between two rows of racks 306, such as between the rows 308F and 308G. In the airflow loop 706, the air is moved through the heat exchangers of the racks 306 to the left of the aisle 320 and in the columns 310A and 310B towards the end 330 of the container 300. When the air reaches the end 330, there is a sufficient space 702 so that the air can turn 180 degrees, at which point the air is moved through the heat exchangers of the racks 306 to the left of the aisle 320 and in the columns 310C and 310D towards the end 332. As noted above in relation to FIG. 7, in actuality the space 702 may be larger than is depicted in FIG. 8. However, when the air reaches the aisle 320, the air again turns 180 degrees, at which point the air is again moved through the heat exchangers of the racks 306 to the left of the aisle 320 and in the columns 310A and 310B, completing the airflow loop 706. As such, the airflow loop 706 is defined to the left of the aisle 320.

In the airflow loop 708, the air is moved through the heat exchangers of the racks 306 to the right of the aisle 320 and in the columns 310C and 310D towards the end 332. When the air reaches the end 332, there is again a sufficient space 704 so that the air can turn 180 degrees, at which point the air is moved through heat exchangers of the racks 306 to the right of the aisle 320 and in the columns 310A and 310B towards the end 330. Like the space 702, the space 704 may be larger than is depicted in FIG. 8. However, when the air reaches the aisle 320, the air again turns 180 degrees, at which point the air is again moved through the heat exchangers of the racks 306 to the right of the aisle 320 and in the columns 310C and 310D, completing the airflow loop 708. As such, the airflow loop 708 is defined to the right of the aisle 320.

The airflow loops 706 and 708 are idealized in the sense that air may also move across the aisle 320. For example, the airflow loop 706 is depicted in FIG. 8 such that after air exits the racks 306 within the row 308F and within the columns 310C and 310D, the air enters the racks 306 within the row 308F and within the columns 310A and 310B. However, in actuality, some of the air exiting the racks 306 within the row 308F and within the columns 310C and 310D may instead move across the aisle 320 and enter the racks 306 within the row 308G and within the columns 310C and 310D. In this respect, then, the airflow loop 706 depicted in FIG. 8 is an idealized airflow loop.

Similarly, the airflow loop 708 is depicted in FIG. 8 such that after air exits the racks 306 within the row 308G and within the columns 310A and 310B, the air enters the racks 306 within the row 308G and within the columns 310C and 310D. However, in actuality, some of the air exiting the racks 306 within the row 308G and within the columns 310A and 310B may instead move across the aisle 320 and enter the racks 306 within the row 308F and within the columns 310A and 310B. In this respect, then, the airflow loop 708 depicted in FIG. 8 is also an idealized airflow loop.

FIGS. 7 and 8 thus demonstrate that regardless of how an aisle is created or defined within the shipping container 300, airflow is not interrupted in such a way as to interrupt cooling of the equipment installed within the racks 306. For example, if from FIG. 7 the racks 306 in the rows 308A, 308B, 308C, 308D, 308E, and 308F are moved to the left to result in FIG. 8, the single airflow loop 804 is simply split into two (idealized) airflow loops 706 and 708. Cooling of the equipment installed within the racks 306 is not affected by the destruction of the aisle 802 and the creation of the aisle 320 in transitioning from FIG. 7 to FIG. 8. The two (idealized) airflow loops 706 and 708 in FIG. 8 provide for sufficient cooling of the equipment installed within the racks 306, no different than the single airflow loop 804 of FIG. 7 does.

In this respect, the embodiments of FIGS. 7 and 8 differ from that of the prior art of FIG. 2, in which the sliding of the racks 214 into the aisle 112 interrupts the airflow and thus interrupts cooling of the equipment installed within the racks 210 and/or 214. By comparison, in the embodiments of FIGS. 7 and 8, the racks 306 are never slid into an aisle. Rather the racks 306 are slid to create an aisle, such as the aisle 320 in FIG. 8 or the aisle 802 in FIG. 7. The racks 306 never leave the airflow. In FIG. 8, all the racks 306 are in either the (idealized) airflow loop 706 or 708, whereas in FIG. 7, all the racks 306 are in the airflow loop 804.

Figure 9:
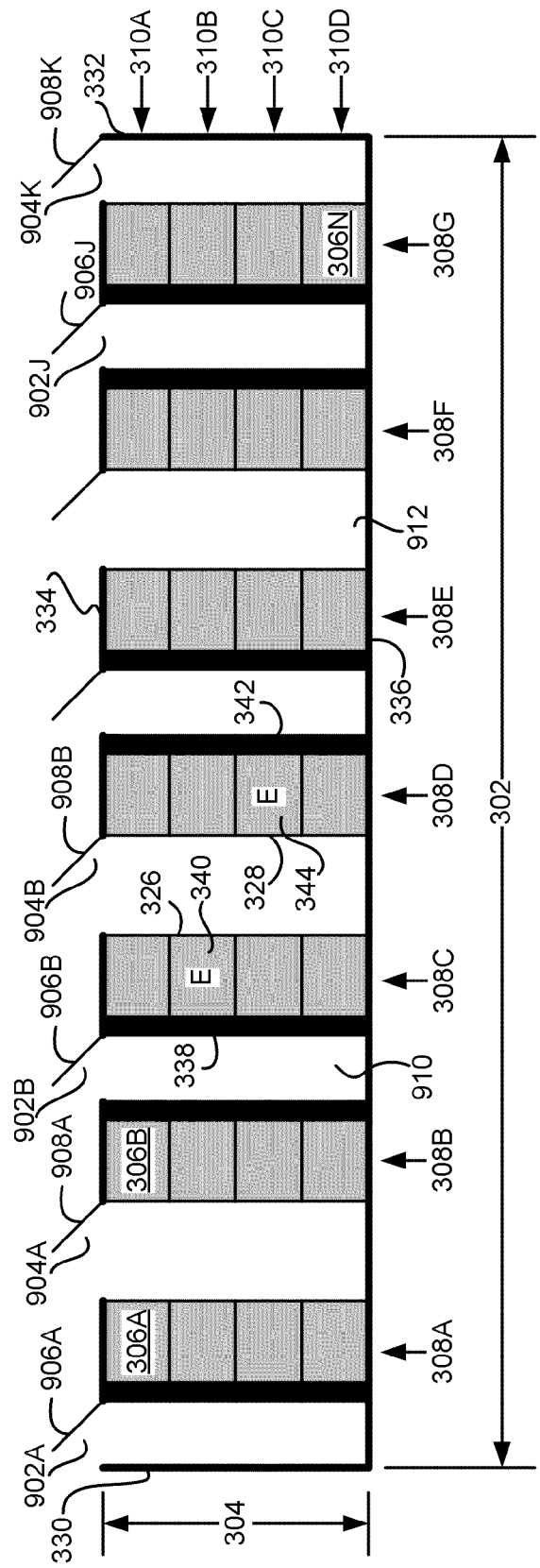
FIG. 9 is a diagram of a container-based data center apart from that of FIG. 3, according to another embodiment of the invention.

FIG. 9 shows a shipping container 300, according to a different embodiment of the invention than that of FIG. 3. The container 300 of FIG. 9 still has a length 302 and a width 304. The length 302 may again be roughly twenty or forty feet in one embodiment, whereas the width 304 may again be roughly eight feet. The shipping container 300 has long sides 334 and 336 parallel to the length 302 and opposite to one another, and ends 330 and 332 parallel to the width 304 and opposite to one another.

In the embodiment of FIG. 9, the long side 334 includes openings 902A, 902B, . . . , 902J, which are collectively referred to as the openings 902, as well as openings 904A, 904B, . . . , 904K, which are collectively referred to as the openings 904. By comparison, the long side 336 does not have any openings. However, in a different embodiment, the long side 336 may have all the openings 902 and 904, such that the long side 334 does not have any. Alternatively, some openings 902 and 904 may be in the long side 336, and other openings 902 and 904 may be in the long side 334. The openings 902 can have corresponding doors 906A, 906B, . . . , 906J, which are collectively referred to as the doors 906, whereas the openings 904 can have corresponding doors 908A, 908B, . . . , 908K, which are collectively referred to as the doors 908.

The container 900 of FIG. 9 still includes racks 306A, 306B, . . . , 306N, which are collectively referred to as the racks 306 and that include the racks 326 and 328. The racks 306 are organized over a number of rows 308A, 308B, 308C, 308D, 308E, 308F, and 308G, which are collectively referred to as the rows 308, and over a number of columns 310A, 310B, 310C, and 310D, which are collectively referred to as the columns 310. There are four racks 306 in each row 308 in the embodiment of FIG. 9. Furthermore, in the embodiment of FIG. 9, there are seven rows 308, but in other embodiments, there may be different numbers of rows 308, such as nine rows, depending on the size of the racks 306 and the desired spacing between adjacent rows 308.

The rack 326 is representative of all the racks 306 within the rows 308A, 308C, 308E, and 308G. As has been described in relation to FIG. 3, a heat exchanger 338 and equipment 340 are installed within the rack 326. Air moves through the heat exchanger 338 from the right to the left. Thus, all the racks 306 within the rows 308A, 308C, 308E, and 308G have heat exchangers through which air moves from the right to the left in FIG. 9.

The rack 328 is representative of all the racks 306 within the rows 308B, 308D, and 308F. As has been described in relation to FIG. 3, a heat exchanger 342 and equipment 344 are installed within the rack 328. Air moves through the heat exchanger 342 from the left the right. Thus, all the racks 306 within the rows 308B, 308D, and 308F have heat exchangers through which air moves from the left to the right in FIG. 9.

Therefore, the air moves through the heat exchangers of the racks 306 within the rows 308A, 308C, 308E, and 308G towards the end 330 of the container 300. It can thus be said that these heat exchangers are installed on the racks 306 of every other row 308 beginning with the row 308A, which is the closest row 308 to the end 330. By comparison, the air moves through the heat exchangers of the racks 306 within the rows 308B, 308D, and 308F towards the end 332 of the container 300. It can thus also be said that these heat exchangers are installed on the racks 306 of every other row 308 beginning with the row 308B, which is the closest row 308 to the row 308A.

Each row 308 of the container 300 in the embodiment of FIG. 3 includes four racks 306 positioned side-to-side, length-wise, and parallel to the width 304, such that there are four columns 310. More generally, each row 308 includes as many of the racks 306 positioned side-side, length-wise, and parallel to the width 304 of the container 300 as can fit within the container 300, such that there may be greater or less of the columns 310 than four columns 310. The racks 306 of each row 308 are stationary and fixed in FIG. 9, and are not slidable as in FIG. 3.

Specifically, the racks 306 are positioned within the container 300 in FIG. 9 to define two different types of aisles. The aisles to which user entry is gained via the openings 902, such as the aisle 910 between the rows 308B and 308C, permit a user to access and service the heat exchangers of the racks 306 of one or two rows 308. The aisles to which user entry is gained via the openings 904, such as the aisle 912 between the rows 308E and 308F, permit a user to access and service the equipment of the racks 306 of one or two rows 308. As such, each side of each row 308 of racks 306 is user accessible by one of these aisles through a corresponding opening 902 or 904.

In the configuration of FIG. 9 that has been described, there are twenty-eight racks 306 organized over seven rows 308 and four columns 310. By comparison, in the prior art configuration of FIG. 1, there are just twenty similarly sized racks 110, and in the prior art configuration of FIG. 2, there are twenty-six similarly sized racks 210 and 212. Therefore, the configuration of FIG. 9 represents an increase in rack capacity and in rack density of 40% in relation to FIG. 1 and of nearly 8% in relation to FIG. 2.

Because the racks 306 in the embodiment of FIG. 9 are stationary and are not movable, airflow that is responsible for cooling of the equipment within the racks 306 cannot be interrupted. Therefore, once a sufficient cooling design of the equipment within the racks 306 has been provided, such cooling is not interrupted when servicing the equipment within the racks 306. This is in comparison to the prior art of FIG. 2, in which the sliding of the racks 214 into the aisle 112 interrupts the airflow and thus interrupts cooling of the equipment installed within the racks 210 and/or 214.

Figure 10:
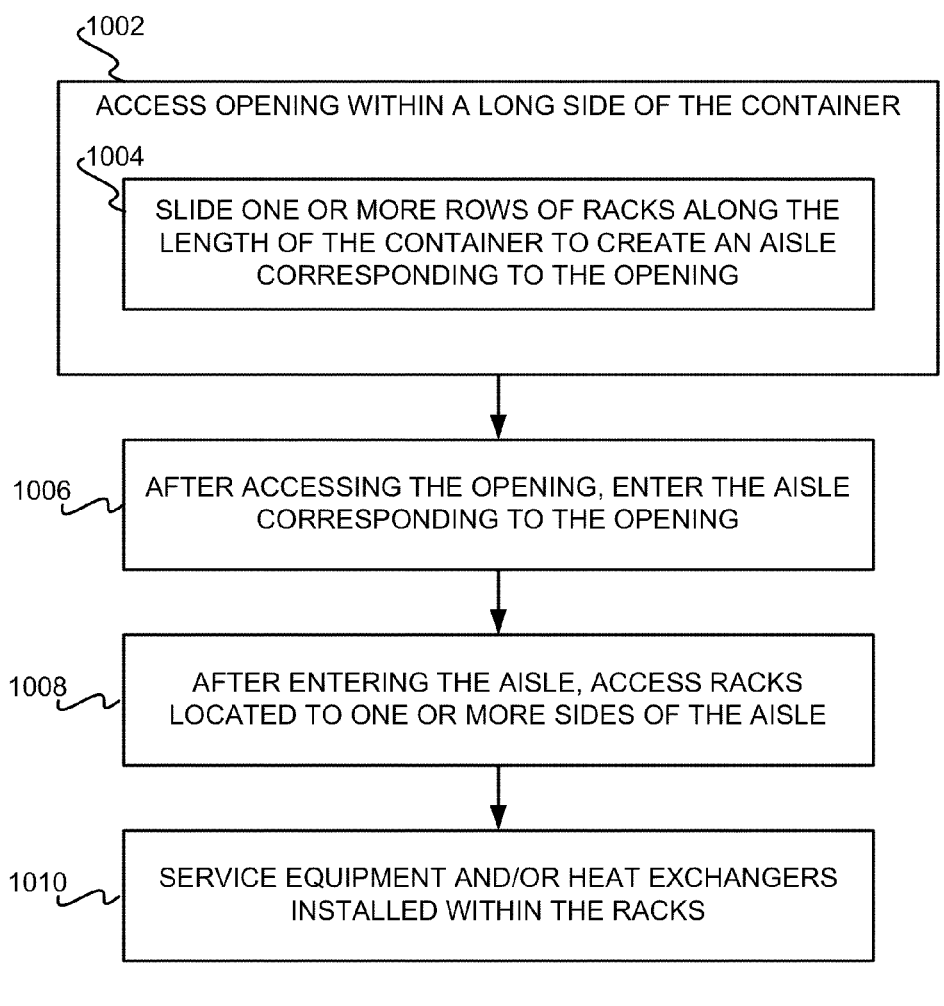
FIG. 10 is a flowchart of a method of use of a container-based data center, according to an embodiment of the invention.

In conclusion, FIG. 10 shows a method 1000, according to an embodiment of the invention. The method 1000 is for using the shipping container 300, such as that of FIG. 3 or that of FIG. 9. A user accesses an opening on one of the long sides 334 and 336 of the container 300, which leads to an aisle at which desired racks 306 can be accessed (1002). In the embodiment of FIG. 3, for instance, the user may first slide one or more of the rows 308 of the racks along the length 302 of the container 300 in order to create the desired aisle corresponding to this opening (1004).

Thereafter, the user enters the aisle that corresponds to the opening (1006). By entering the aisle, the user can then access the racks 306 located to one or more sides of the aisle (1008). By accessing these racks 306, the user thus can service the equipment and/or the heat exchangers installed within the racks 306 (1010), as are accessible from the aisle that the user has entered.

It is finally noted that, although specific embodiments have been illustrated and described herein, it will be appreciated by those of ordinary skill in the art that any arrangement that is calculated to achieve the same purpose may be substituted for the specific embodiments shown. Other applications and uses of embodiments of the invention, besides those described herein, are amenable to at least some embodiments. This application is intended to cover any adaptations or variations of the present invention. Therefore, it is manifestly intended that this invention be limited only by the claims and equivalents thereof.

We claim:
1. A system comprising:
a container having a width, a length, and a height, the length greater than the width, the container having a first long side and a second long side parallel to the length;
a plurality of racks organized in a plurality of rows parallel to the width of the container, each rack of the plurality of racks receptive to installation of electronic equipment along a height of the each rack, the height of the each rack parallel to the height of the container;
a plurality of first openings within the first long side of the container; and,
a plurality of second openings within the second long side of the container, the plurality of first openings staggered in relation to the plurality of second openings such that each of the plurality of first openings and each of the plurality of second openings is at a different distance from a first end of the container, the first end parallel to the width of the container,
wherein a first distance is parallel to the length of the container and is defined from a center of one of the plurality of first openings to a center of one of the plurality of second openings closest to the one of the plurality of first openings,
wherein a second distance is parallel to the length of the container and is defined by a depth of the each rack of the plurality of racks in the plurality of rows, the second distance being at least substantially equal to the first distance,
wherein each row of the plurality of rows is slidable in unison back and forth along the length of the container between a first position at which the one of the plurality of rows blocks the one of the plurality of first openings and a second position at which the one of the plurality of rows blocks the one of the plurality of second openings closest to the one of the plurality of first openings.

2. The system of claim 1, wherein the each row includes as many of the plurality of racks positioned side-to-side, lengthwise, and parallel to the width of the container as can fit within the container.

3. The system of claim 1, wherein all of the plurality of first openings and the plurality of second openings except for a given opening of the plurality of first openings and the plurality of second openings are blocked by the plurality of rows at any given time, such that the given opening provides user access to a given aisle within the container.

4. The system of claim 3, wherein which of the plurality of first openings and the plurality of second openings is the given opening changes depending on an arrangement of the plurality of rows in which the plurality of racks of the plurality of rows have been slid along the length of the container.

5. The system of claim 3, wherein the plurality of first openings and the plurality of second openings comprise:
a first end opening that is closest to the first end of the container; and,
a second end opening that is closest to a second end of the container, the second end opposite the first end,
wherein where the given opening is any of the plurality of first openings and the plurality of second openings except for the first end opening and the second end opening, the given aisle provides access to a first row of the plurality of rows on a first side of the given aisle and to a second row of the plurality of rows on a second side of the given aisle, the second row opposite to the first row,
such that the plurality of rows other than the first row and the second row are inaccessible.

6. The system of claim 3, wherein the plurality of first openings and the plurality of second openings comprise:
a first end opening that is closest to the first end of the container; and,
a second end opening that is closest to a second end of the container, the second end opposite the first end,
wherein where the given opening is one of the first end opening and the second end opening, the given aisle provides user access to only one of the plurality of rows to one side of the given aisle,
such that the plurality of rows other than the one of the plurality of rows to the one side of the given aisle are inaccessible.

7. A system comprising:
a container having a width, a length, and a height, the length greater than the width, the container having a first long side and a second long side parallel to the length;
a plurality of racks organized in a plurality of rows parallel to the width of the container, each rack of the plurality of racks receptive to installation of electronic equipment along a height of the each rack, the height of the each rack parallel to the height of the container;
a plurality of heat exchangers, each heat exchanger installed on one of the plurality of the racks to cool air exhausted by any electronic equipment installed on the one of the plurality of the racks;
a plurality of first openings within the first long side of the container; and,
a plurality of second openings within the second long side of the container, the plurality of first openings staggered in relation to the plurality of second openings such that each of the plurality of first openings and each of the plurality of second openings is at a different distance from a first end of the container, the first end parallel to the width of the container,
wherein a first distance is parallel to the length of the container and is defined from a center of one of the plurality of first openings to a center of one of the plurality of second openings closest to the one of the plurality of first openings,
wherein a second distance is parallel to the length of the container and is defined by a depth of the each rack of the plurality of racks in the plurality of rows, the second distance being at least substantially equal to the first distance,
wherein each row of the plurality of rows is slidable in unison back and forth along the length of the container between a first position at which the one of the plurality of rows blocks the one of the plurality of first openings and a second position at which the one of the plurality of rows blocks the one of the plurality of second openings closest to the one of the plurality of first openings.

8. The system of claim 7, wherein all of the plurality of first openings and the plurality of second openings except for a given opening of the plurality of first openings and the plurality of second openings are blocked by the plurality of rows at any given time, such that the given opening provides user access to a given aisle within the container.

9. The system of claim 8, wherein which of the plurality of first openings and the plurality of second openings is the given opening changes depending on an arrangement of the plurality of rows in which the plurality of racks of the plurality of rows have been slid along the length of the container.

10. The system of claim 8, wherein the plurality of first openings and the plurality of second openings comprise:
a first end opening that is closest to the first end of the container; and,
a second end opening that is closest to a second end of the container, the second end opposite the first end,
wherein where the given opening is any of the plurality of first openings and the plurality of second openings except for the first end opening and the second end opening, the given aisle provides access to a first row of the plurality of rows on a first side of the given aisle and to a second row of the plurality of rows on a second side of the given aisle, the second row opposite to the first row such that the plurality of rows other than the first row and the second row are inaccessible,
and a total of two airflow loops including a first airflow loop and a second airflow loop are defined within the container, the first airflow loop defined to the first side of the given aisle, and the second airflow loop defined to the second side of the given aisle opposite the first side.

11. The system of claim 8, wherein the plurality of first openings and the plurality of second openings comprise:
a first end opening that is closest to the first end of the container; and,
a second end opening that is closest to a second end of the container, the second end opposite the first end,
wherein where the given opening is one of the first end opening and the second end opening,
the given aisle provides user access to only one of the plurality of rows to one side of the given aisle, such that the plurality of rows other than the one of the plurality of rows to the one side of the given aisle are inaccessible,
and a single airflow loop is defined within the container to the one side of the given aisle at which all the plurality of racks are currently positioned.

12. The system of claim 7, further comprising the electronic equipment installed in the plurality of racks.

13. A method comprising:
accessing a given opening of a plurality of first openings within a first long side of a container and a plurality of second openings within a second long side of the container, the container having a width, a length, and a height, the length greater than the width, the first long side and the second long side are parallel to the length of the container;
organizing a plurality of racks in a plurality of rows parallel to the width of the container, each rack of the plurality of racks receptive to installation of electronic equipment along a height of the each rack, the height of the each rack parallel to the height of the container;
staggering the plurality of first openings in relation to the plurality of second openings such that each of the plurality of first openings and each of the plurality of second openings is at a different distance from a first end of the container, the first end parallel to the width of the container;
providing a first distance parallel to the length of the container and defined from a center of one of the plurality of first openings to a center of one of the plurality of second openings closest to the one of the plurality of first openings,
providing a second distance parallel to the length of the container and is defined by a depth of the each rack of the plurality of racks in the plurality of rows, the second distance being at least substantially equal to the first distance,
sliding each row of the plurality of rows in unison back and forth along the length of the container between a first position at which the one of the plurality of rows blocks the one of the plurality of first openings and a second position at which the one of the plurality of rows blocks the one of the plurality of second openings closest to the one of the plurality of first openings;

after accessing the given opening, entering an aisle corresponding to the given opening; and, after entering the aisle corresponding to the given opening, accessing the plurality of racks that are located to one or more sides of the aisle.

* * * * *